(12) United States Patent
Dalmia et al.

(10) Patent No.: US 11,937,367 B2
(45) Date of Patent: Mar. 19, 2024

(54) RADIO FREQUENCY FRONT-END STRUCTURES

(71) Applicant: Intel Corporation, Santa Clara, CA (US)

(72) Inventors: Sidharth Dalmia, Portland, OR (US); Zhenguo Jiang, Chandler, AZ (US); William J. Lambert, Chandler, AZ (US); Kirthika Nahalingam, San Jose, CA (US); Swathi Vijayakumar, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/346,313

(22) Filed: Jul. 3, 2023

(65) Prior Publication Data

US 2023/0354508 A1    Nov. 2, 2023

Related U.S. Application Data

(63) Continuation of application No. 16/268,318, filed on Feb. 5, 2019, now Pat. No. 11,729,902.

(51) Int. Cl.
| | | |
|---|---|---|
| *H05K 1/02* | (2006.01) | |
| *G06F 1/16* | (2006.01) | |
| *H01F 5/04* | (2006.01) | |
| *H01L 25/16* | (2023.01) | |
| *H04B 1/40* | (2015.01) | |
| *H05K 1/18* | (2006.01) | |

(52) U.S. Cl.
CPC .......... *H05K 1/0243* (2013.01); *G06F 1/1613* (2013.01); *H01F 5/04* (2013.01); *H05K 1/028* (2013.01); *H05K 1/181* (2013.01); *H05K 1/189* (2013.01); *G06F 1/1626* (2013.01); *G06F 1/163* (2013.01); *G06F 2200/1631* (2013.01); *H01L 25/16* (2013.01); *H04B 1/40* (2013.01); *H05K 2201/1006* (2013.01); *H05K 2201/10098* (2013.01)

(58) Field of Classification Search
CPC ...... H05K 1/0243; H05K 1/028; H05K 1/181; H05K 1/189; H05K 1/0239; H05K 1/165; H05K 2201/1006; H05K 2201/10098; G06F 1/1613; G06F 1/1626; G06F 1/263; G06F 2200/1631; H01F 5/04; H01L 25/16; H01L 25/18; H01L 2924/00014; H01L 2924/15311; H01L 2223/6655; H01L 2223/6677; H01L 2224/0401; H01L 2224/16225; H01L 23/642; H01L 23/645; H01L 23/552; H01L 23/66; H01L 23/49838; H01L 23/49822; H04B 1/40; H01Q 1/2283

See application file for complete search history.

(56) References Cited

U.S. PATENT DOCUMENTS

2019/0304936 A1* 10/2019 Shaul ...................... H01L 24/20

* cited by examiner

*Primary Examiner* — Anne M Hines
*Assistant Examiner* — Jose M Diaz
(74) *Attorney, Agent, or Firm* — Akona IP PC

(57) ABSTRACT

Disclosed herein are radio frequency (RF) front-end structures, as well as related methods and devices. In some embodiments, an RF front-end package may include an RF package substrate including an embedded passive circuit element. At least a portion of the embedded passive circuit element may be included in a metal layer of the RF package substrate. The RF package substrate may also include a ground plane in the metal layer.

20 Claims, 8 Drawing Sheets

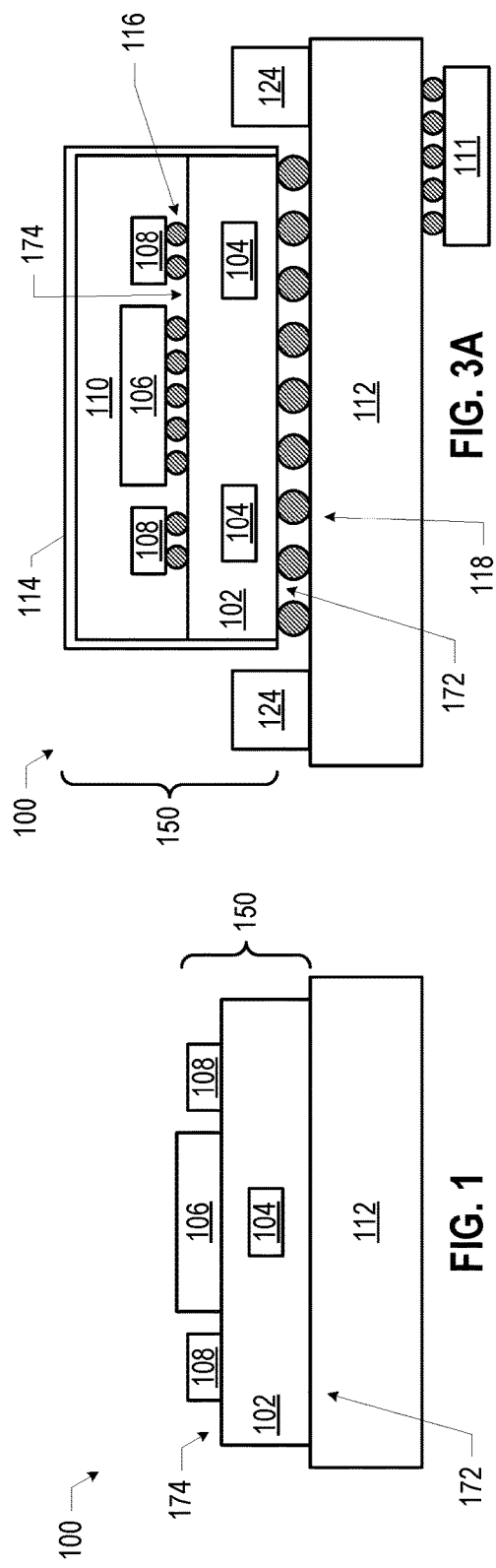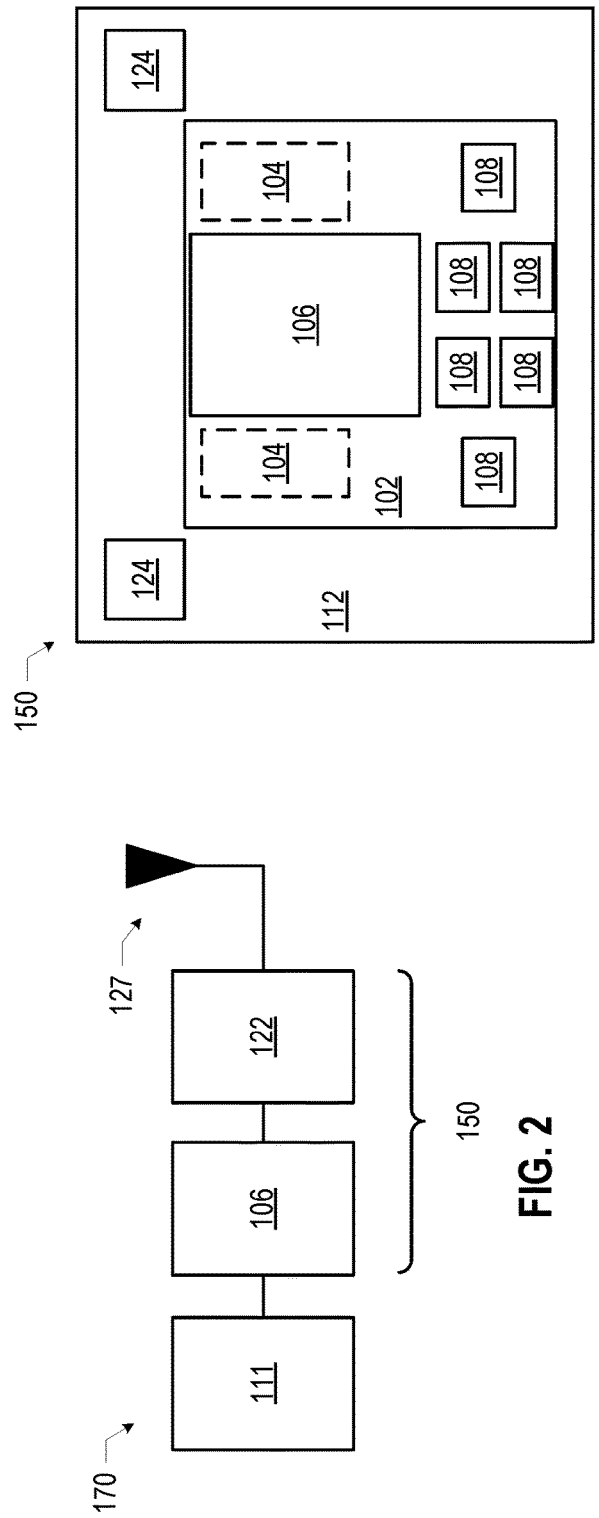

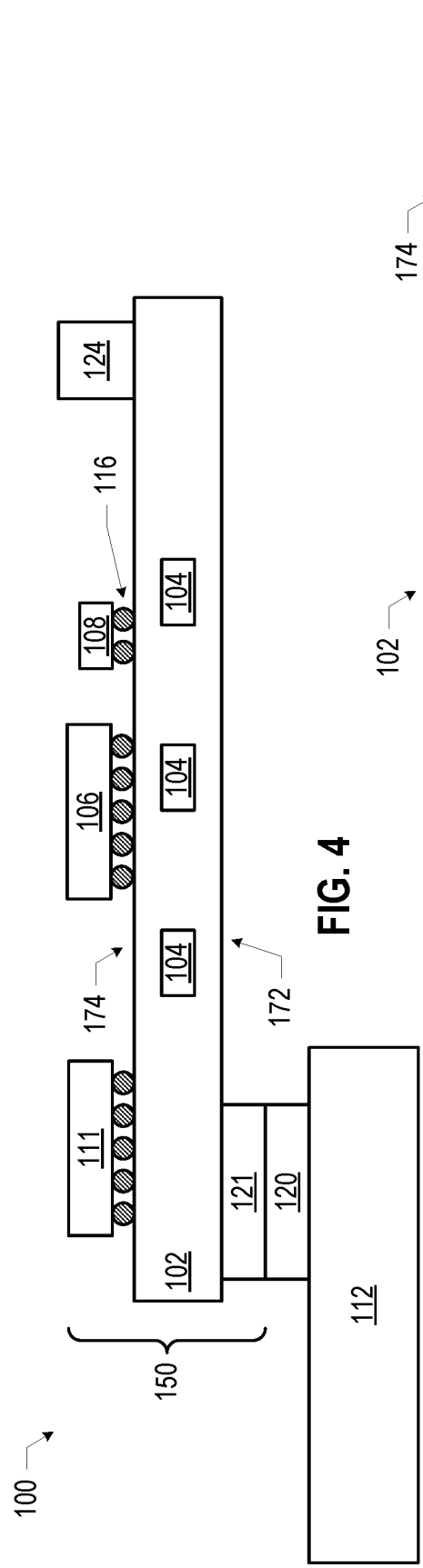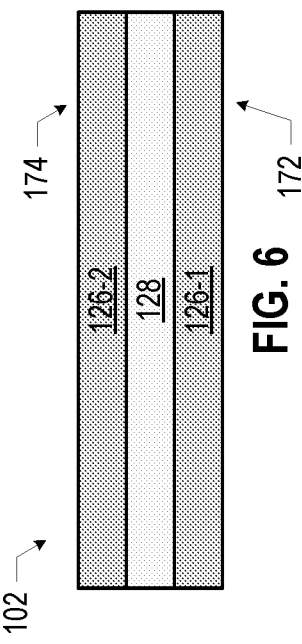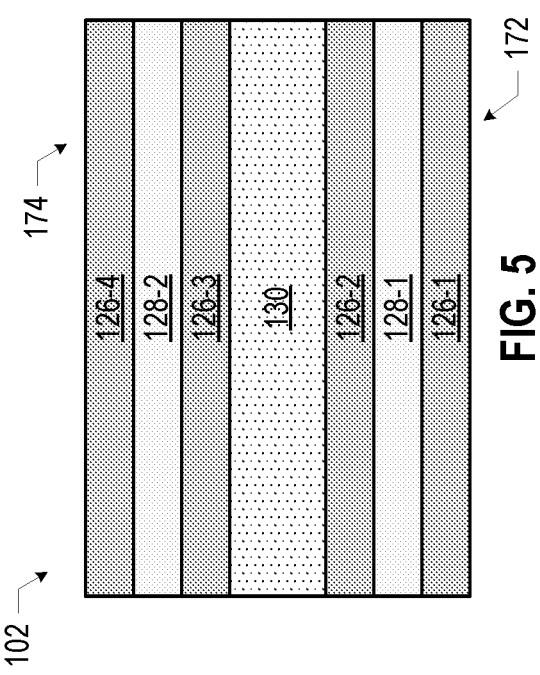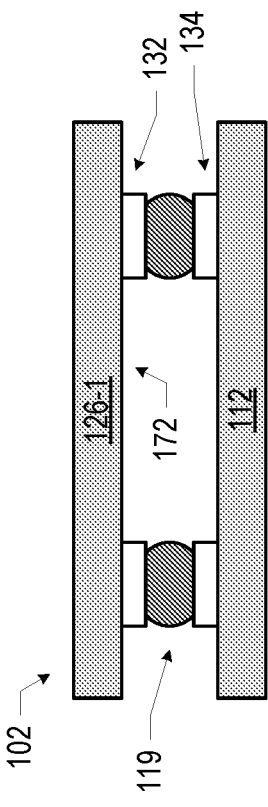

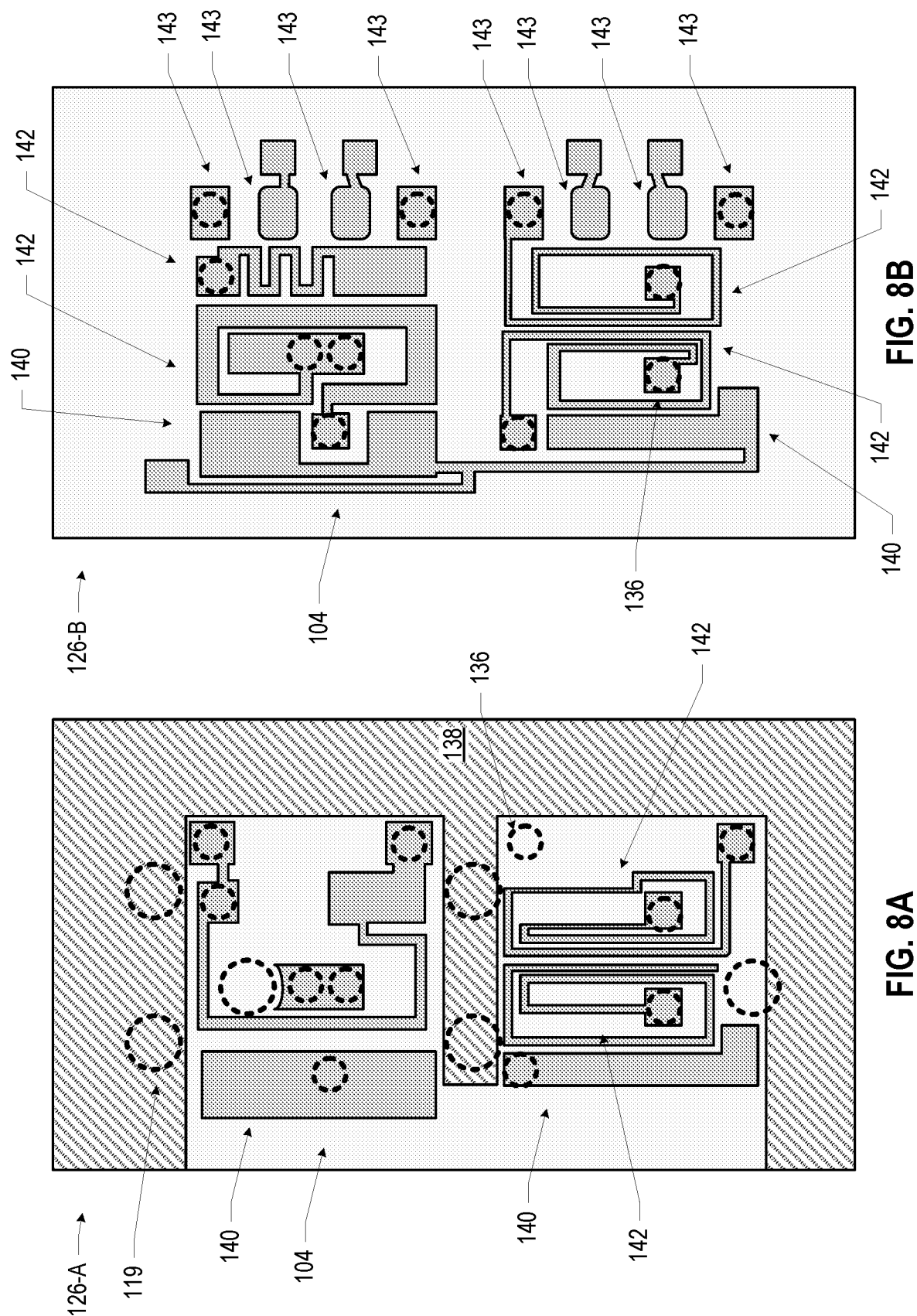

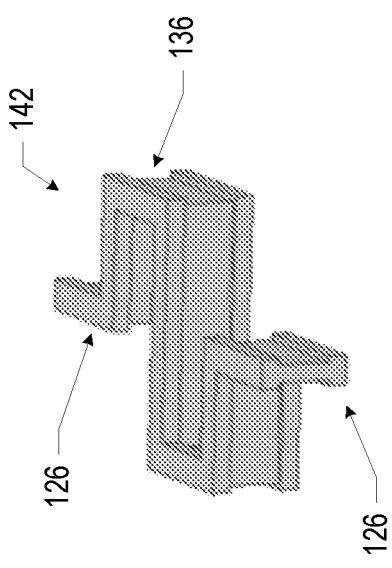
FIG. 9
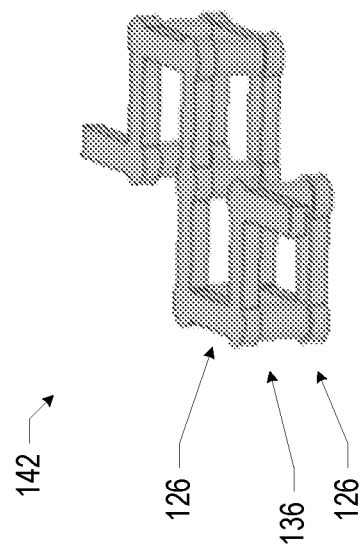
FIG. 11
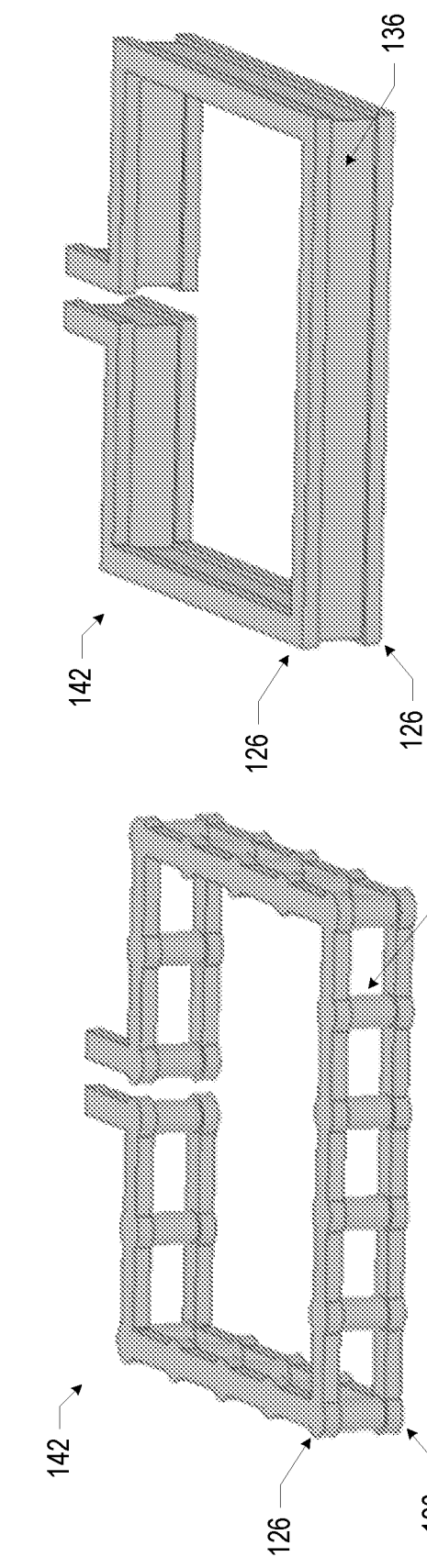
FIG. 10
FIG. 12

RADIO FREQUENCY FRONT-END STRUCTURES

CROSS-REFERENCE TO RELATED APPLICATION

This application is a continuation of (and claims the benefit and priority under 35 U.S.C. 120 of) U.S. application Ser. No. 16/268,318, filed Feb. 5, 2019, entitled "RADIO FREQUENCY FRONT-END STRUCTURES," the disclosure of which is considered part of, and is incorporated by reference in, the disclosure of this application.

BACKGROUND

Wireless communication devices, such as handheld computing devices and wireless access points, may include passive front-end circuitry between the antenna and a baseband processing device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 1 is a side, cross-sectional view of a radio frequency (RF) communication assembly including an RF front-end package, in accordance with various embodiments.

FIG. 2 is a block diagram of an RF communication system that may include an RF front-end package, in accordance with various embodiments.

FIGS. 3A and 3B are side and top views, respectively, of an example RF communication assembly, in accordance with various embodiments.

FIG. 4 is a side, cross-sectional view of another example RF communication assembly, in accordance with various embodiments.

FIGS. 5 and 6 are side, cross-sectional views of example RF front-end package substrates that may be included in an RF front-end package, in accordance with various embodiments.

FIG. 7 is a side, cross-sectional view of an example interface between an RF front-end package substrate and a circuit board in an RF communication assembly, in accordance with various embodiments.

FIGS. 8A and 8B illustrate different example layers in an RF front-end package substrate, in accordance with various embodiments.

FIGS. 9-12 are perspective views of example inductors that may be included in an RF front-end package substrate, in accordance with various embodiments.

DETAILED DESCRIPTION

Figure 13:
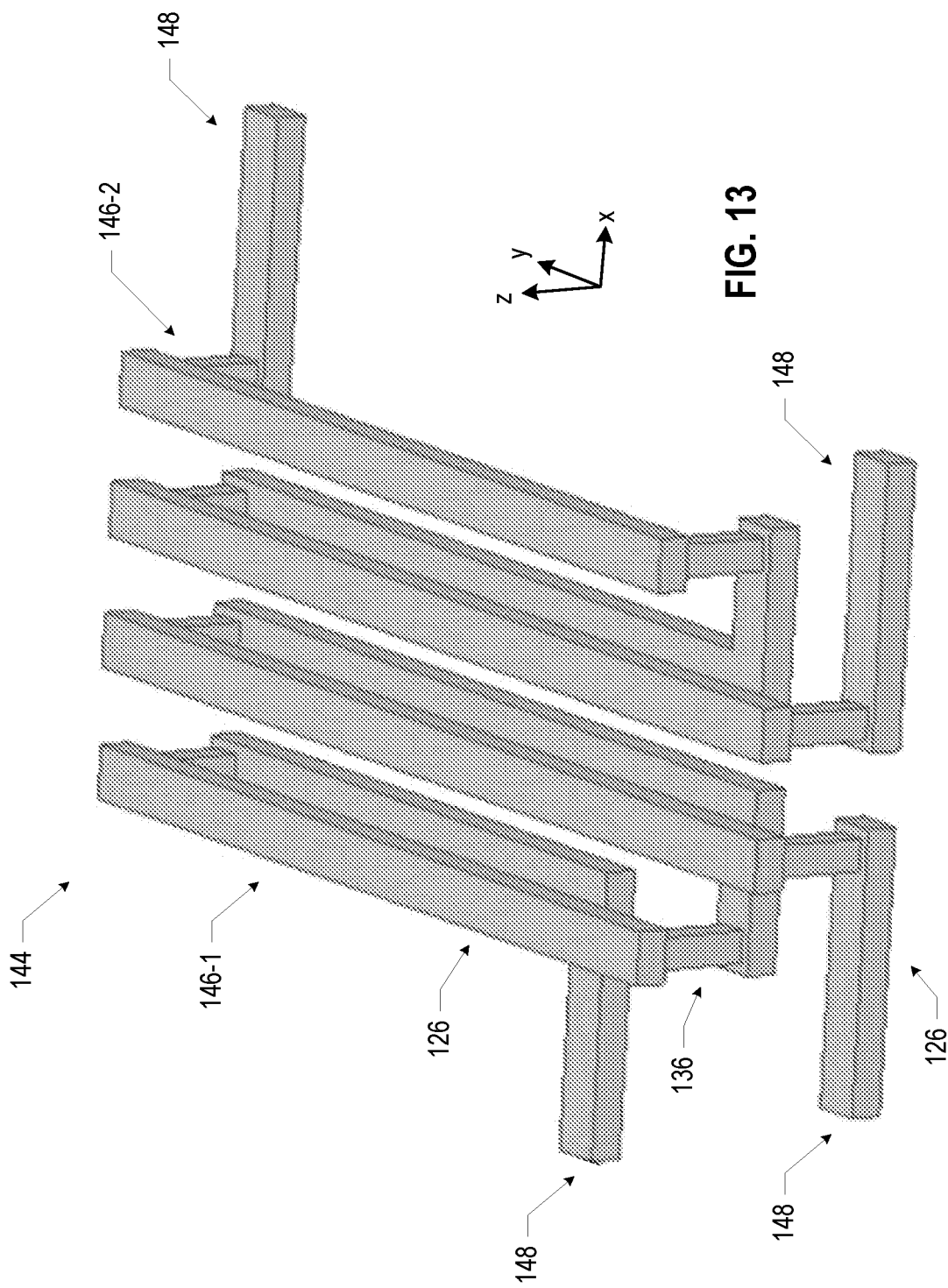
FIG. 13 is a perspective view of an example balun that may be included in an RF front-end package substrate, in accordance with various embodiments.

Disclosed herein are radio frequency (RF) front-end structures, as well as related methods and devices. In some embodiments, an RF front-end package may include an RF package substrate including an embedded passive circuit element. At least a portion of the embedded passive circuit element may be included in a metal layer of the RF package substrate. The RF package substrate may also include a ground plane in the metal layer.

RF front-end modules for Wi-Fi and other wireless communication technologies may be included in a number of different types of computing devices. When these computing devices are end-user devices (e.g., handheld, tablet, and wearable devices), reducing the size of the RF front-end modules may be an important part of creating small and thin end-user devices. Described herein are RF front-end packages and assemblies that may exhibit improved electrical and/or wireless performance and/or may have a smaller size than previous structures, enabling improved functionality and adoptability of RF communication technology In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "integrated circuit (IC) package" are synonymous. When used to describe a range of dimensions, the phrase "between X and Y" represents a range that includes X and Y. For convenience, the phrase "FIG. 3" may be used to refer to the collection of drawings of FIGS. 3A-3B, and the phrase "FIG. 8" may be used to refer to the collection of drawings of FIGS. 8A-8B.

FIG. 1 is a side, cross-sectional view of an example RF communication assembly 100 including an RF front-end package 150 coupled to a circuit board 112. The RF front-end package 150 may be coupled to a circuit board 112 (e.g., by solder balls or a connector, as discussed further below). The RF communication assembly 100 may be included in a handheld computing device (e.g., a smart phone or tablet), a wearable computing device (e.g., a smartwatch), a server device, or any other suitable communication device. In some embodiments, the RF communication assembly 100 may support dual- or multi-band communications extending from frequencies of a few megahertz to tens of gigahertz at millimeter wave (e.g., dual-band Wi-Fi, 5G millimeter wave, etc.).

The RF front-end package 150 may include a package substrate 102, and RF front-end die 106 coupled to a surface 172/174 of the package substrate 102, one or more discrete components 108 coupled to a surface 172/174 of the package substrate 102, and one or more embedded components 104 disposed between the surfaces 172 and 174 of the package substrate 102. Although FIG. 1 (and others of the accompanying drawings) depict a single die and multiple discrete components 108 all coupled to the surface 174 of the package substrate 102, this is simply for ease of illustration, and an RF front-end package 150 may include more than one die and/or fewer discrete components 108, and these elements may be distributed as desired across one or both surfaces 172/174 of the package substrate 102. For example, in some embodiments, one or more discrete components 108 may be coupled to the surface 172 of the package substrate 102 that faces the circuit board 112 in the RF communication assembly 100. The discrete components 108 may be, for example, surface mount devices.

The package substrate 102 may be formed of a dielectric material (e.g., a ceramic, a buildup film, an epoxy film having filler particles therein, glass, an organic material, an inorganic material, combinations of organic and inorganic materials, a material having embedded portions formed of different materials, etc.), and may have conductive pathways extending through the dielectric material between the surfaces 172 and 174, between different locations on the surface 172, and/or between different locations on the surface 174. These conductive pathways may take the form of any of the interconnects 1628 discussed below with reference to FIG. 16. FIG. 1 illustrates a single embedded component 104 in the package substrate 102, but this number and location of embedded components 104 in the RF front-end package 150 is simply illustrative, and any number of embedded components 104 (with any suitable structure) may be included in a package substrate 102. As discussed further below, the embedded components 104 themselves may be formed by conductive pathways (e.g., combinations of patterned lines and vias) in the package substrate 102. In some embodiments, the package substrate 102 may be a cored package substrate or a coreless package substrate.

The package substrate 102 may include conductive contacts (not shown) at the surface 174 and conductive contacts (not shown) at the surface 172 that are coupled to conductive pathways (not shown) through the package substrate 102. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). The conductive contacts at the surface 174 may allow circuitry within the RF front-end die 106 and/or the discrete components 108 to electrically couple to each other (via the conductive pathways in the package substrate 102), to the embedded components 104, and/or to the conductive contacts at the surface 172. Similarly, the conductive contacts at the surface 172 may allow circuits within the circuit board 112 to electrically coupled to each other (via the conductive pathways in the package substrate 102), to the embedded components 104, and/or to the conductive contacts at the surface 174.

In some embodiments, the RF front-end die 106 and/or the discrete components 108 may not be directly coupled to the package substrate 102, but may be coupled to the package substrate 102 via an intervening interposer (not shown). In some embodiments, the package substrate 102 itself may include an embedded bridge having higher density conductive pathways than the rest of the package substrate 102 (e.g., a silicon bridge embedded in an otherwise organic substrate); in such embodiments, the RF front-end die 106 and/or the discrete components 108 may be coupled to the embedded bridge. More generally, one or more dies and/or discrete components 108 may be coupled to the package substrate 102 via any suitable structure (e.g., a silicon bridge, an organic bridge, one or more waveguides, one or more interposers, wirebonds, etc.).

Although the RF front-end package 150 illustrated in FIG. 3 is a flip chip package, other package architectures may be used. For example, the RF front-end package 150 may be a ball grid array (BGA) package, such as an embedded wafer-level ball grid array (eWLB) package. In another example, the RF front-end package 150 may be a wafer-level chip scale package (WLCSP) or a panel fanout (FO) package. The circuit board 112 may be a printed circuit board (PCB) (e.g., a motherboard), or may be an interposer or another IC package, as known in the art and as discussed below with reference to FIG. 17.

FIG. 2 is a block diagram of an RF communication system 170 that may include an RF front-end package 150, in accordance with various embodiments. In the RF communication system 170 of FIG. 2, the RF front-end die 106 is communicatively coupled to one or more antennas 127 via intervening RF front-end circuitry 122. For example, an RF front-end die 106 may include one or more power amplifiers (PAs), one or more low noise amplifiers (LNAs), phase shifters, and/or other front-end circuitry. The RF front-end circuitry 122 may be implemented by the discrete components 108 and/or the embedded components 104, in combination. In some embodiments, the RF front-end circuitry 122 may be passive circuitry. Examples of circuits that may be included in the RF front-end circuitry 122 may include multiplexers (e.g., diplexers), filters (e.g., band pass filters, low pass filters, harmonic filters, etc.), baluns, couplers, combiners, and/or matching filters, among others. The RF front-end circuitry 122 may perform important functions; for example, baluns may be used to reduce to eliminate common mode noise, and multiplexers may enable the sharing of antenna 127 between communications in different frequency bands. A number of examples of elements of the RF front-end circuitry 122 are discussed herein, and any one or more may be utilized in an RF front-end package 150. A baseband processor 111 (e.g., an application processor) may perform baseband operations on signals transmitted by/received at the RF communication system 170. A baseband processor 111 may be coupled to the circuit board 112 (e.g., as illustrated in FIG. 3) or to the package substrate 102 (e.g., as illustrated in FIG. 4).

Returning to FIG. 1, in some embodiments, a logic die (not shown) may be included in the RF front-end package 150. A logic die may include logic circuitry to control the operation of the RF front-end die 106. For example, a logic die may include complementary metal oxide semiconductor (CMOS) logic, and may provide electrical signals to the RF front-end die 106 to control operation of the RF front-end die 106. In some embodiments, a logic die may include circuitry to implement a state machine, mixer circuitry, voltage-controlled oscillators, etc. An RF front-end die 106 may include front-end circuitry for, along with one or more antennas 127 (as discussed above with reference to FIG. 2), performing RF communications. In some embodiments, a logic die may also include one or more amplifiers (e.g., a CMOS PA and/or a CMOS LNA). The RF front-end die 106 may have higher output power than the logic die. For example, the logic die may have an output power between 0 dbm and 5 dbm, while the RF front-end die 106 may have an output power between 20 dbm and 35 dbm (e.g., between 100 milliwatts and 2 watts).

In an RF communication assembly 100, the RF front-end die 106 may be closer to an associated antenna 127 than that antenna 127 is to the logic die. In some embodiments, the RF front-end die 106 may be between the antenna 127 and the logic die; as used herein, a first element may be "between" two other elements if the first element is in a layer or plane that is between the layers or planes in which the other elements are located. Because losses in an RF communication system increase over distance, having the RF front-end die 106 close to an associated antenna 127 may reduce the losses relative to an embodiment in which the circuitry of the RF front-end die 106 is included in a single die along with the circuitry in the logic die. For example, power levels of a PA in the RF front-end die 106 may be controlled to improve or optimize throughput and battery life in mobile communication devices, relative to conventional approaches. Further, separating the circuitry of the logic die from the circuitry of the RF front-end die 106 may allow the logic die and the RF front-end die 106 to utilize different IC technologies to improve or optimize their respective functionalities; for example, in some embodiments, the logic die may be based on silicon technology, while the RF front-end die 106 may be based on III-V material technology (e.g., including gallium nitride, gallium arsenide, or indium phosphide) or another technology (e.g., silicon-on-insulator, or silicon germanium bipolar heterojunction transistors). In other embodiments, the RF front-end die 106 may include the logic circuitry of a logic die, and thus no logic die may be present. For ease of illustration, logic dies are omitted from various ones of the accompanying drawings, but any of the embodiments disclosed herein may include a RF front-end die 106 and a distinct logic die.

In some embodiments, the RF front-end die 106 may include one or more passive components (e.g., inductors, varactors, or capacitors) in its metallization stack (e.g., in the top layers of the metallization stack 1619 discussed below with reference to FIG. 16). These passive components may be part of the RF front-end circuitry 122, and including them in the RF front-end die 106 may reduce the required size of the package substrate 102 (e.g., by moving capacitors would otherwise be implemented on or in the package substrate 102 into the RF front-end die 106) and may improve performance (e.g., by bringing these passive components closer to the transistors of the RF front-end circuitry 122). In some embodiments, capacitors or other passive components included in the metallization stack of the RF front-end die 106 may be tunable based on control signals provided by the transistors in the RF front-end die 106 (e.g., the capacitance of the capacitor and/or the inductance of an inductor may be adjusted dynamically). Such embodiments may add additional design flexibility and/or performance improvements.

The dimensions of the elements of an RF front-end package 150 may have any suitable values. For example, in some embodiments, an RF front-end die 106 may have a footprint that is smaller than 6 square millimeters (e.g., smaller than 3 millimeters by 2 millimeters). The package substrate 102 may have a footprint that is smaller than 13 square millimeters (e.g., smaller than 2.5 millimeters by 5 millimeters), or smaller than 9 square millimeters.

The RF assemblies 100 and RF front-end packages 150 disclosed herein may take any of a number of forms. For example, FIGS. 3A and 3B are side and top views, respectively, of an example RF communication assembly 100, in accordance with various embodiments. In the top view of FIG. 3B, the mold material 110 and the conformal metal layer 114 are omitted. The RF communication assembly 100 of FIG. 3 includes an RF front-end package 150 coupled to a circuit board 112, along with a baseband processor 111 and one or more antenna connectors 124 (e.g., coaxial connectors). In the embodiment of FIG. 3 (and any of the accompanying drawings), an antenna 127 itself (e.g., in a package) may replace the antenna connector 124. The elements of the RF front-end package 150 may communicate with the baseband processor 111 and the antenna connectors 124 via the circuit board 112. The antenna connectors 124 may provide connections for cables to associated antennas 127 (not shown). The RF front-end die 106 and the embedded components 104 may be coupled to a surface 172/174 of the package substrate 102 by first-level interconnects 116. The first-level interconnects 116 illustrated in FIG. 3A are solder bumps, but any suitable first-level interconnects 116 may be used. Second-level interconnects 118 may couple conductive contacts (not shown) at the surface 172 to conductive contacts (not shown) on the surface of the circuit board 112. The second-level interconnects 118 illustrated in FIG. 3A are solder balls (e.g., for a BGA arrangement), but any suitable second-level interconnects 118 may be used (e.g., pins in a pin grid array arrangement, lands in a land grid array arrangement, or a connector arrangement as illustrated in FIG. 4).

In some embodiments, a mold material 110 may be disposed around the RF front-end die 106/discrete components 108 and in contact with the package substrate 102. Example materials that may be used for the mold material 110 are epoxy mold materials, as suitable. In some embodiments, an underfill material (not shown) may be disposed on the package substrate 102 around the first-level interconnects 116. The underfill material may be the same as the mold material 110.

In the embodiment of FIG. 3, a conformal metal layer 114 is disposed on a top face of the mold material 110 and down along side faces of the mold material 110 and the package substrate 102. The conformal metal layer 114 may be sputtered or otherwise deposited on the RF front-end package 150. In some embodiments, the conformal metal layer 114 may provide an electromagnetic shield around the components of the RF front-end package 150. In some embodiments, the conformal metal layer 114 may be grounded (e.g., by an interconnect in the package substrate 102 that makes contact with the conformal metal layer 114 at side faces of the package of 102, and then also by a conductive pathway to a ground in the circuit board 112 via the second-level interconnects 118). In some such embodiments, the conformal metal layer 114 may serve as a ground for the embedded components 104 in the package substrate 102, and thus no ground plane may be present in the package substrate 102. Such embodiments may reduce the complexity and/or layer count of the package substrate 102, "off-loading" the ground plane functionality to the conformal metal layer 114.

FIG. 4 is a side, cross-sectional view of another example RF communication assembly 100, in accordance with various embodiments. In the embodiment of FIG. 4, the RF front-end package 150 includes a flexible package substrate 102 (e.g., a flexible printed circuit (FPC) using polyimide or another plastic as the dielectric) on which the RF front-end die 106 and the discrete components 108 may be disposed. Also disposed on the flexible package substrate 102 of FIG. 4 may be one or more antenna connectors 124 (e.g., as discussed above with reference to FIG. 3) and a baseband processor 111. The RF front-end die 106 may be disposed between the baseband processor 111 and the antenna connectors 124 so that the RF front-end die 106 is closer to the antennas 127 (not shown) then the baseband processor 111. The RF front-end package 150 of FIG. 4 may include a connector 121 that mates with a connector 120 on the circuit board 112 to achieve electrical coupling between the RF front-end package 150 and the circuit board 112. In other embodiments, the baseband processor 111 may not be coupled to the surface of the flexible package substrate 102, but may instead be coupled to the circuit board 112. The flexible package substrate 102 of the embodiment of FIG. 4 may serve as a "cable" between the baseband processor 111 and the antenna connector 124, but also may advantageously support the RF front-end die 106, the discrete components 108, and the embedded components 104 along its length, reducing the overall footprint of the RF communication assembly 100 relative to embodiments using conventional structures. A flexible package substrate 102 may be lighter than a conventional rigid package substrate 102, and may be particularly suitable for wearable applications in which bendability may be advantageous.

The package substrates 102 of any of the RF front-end packages 150 disclosed herein (e.g., the RF front-end packages 150 of FIGS. 3 and 4) may take any suitable form. For example, FIGS. 5 and 6 are side, cross-sectional views of example package substrates 102 that may be included in an RF front-end package 150, in accordance with various embodiments. FIGS. 5 and 6 depicts the arrangement of layers in different example package substrates 102; the metal layers may be patterned, and vias through the dielectric between the metal layers may be formed, to form the embedded components 104 and any other desired conductive pathways. The package substrates 102 of FIGS. 5 and 6 may be used in any suitable ones of the RF front-end packages 150 disclosed herein (e.g., the RF front-end packages 150 of FIGS. 3 and 4).

The package substrate 102 of FIG. 5 includes 4 metal layers (126-1, 126-2, 126-3, and 126-4), two dielectric layers 128-1 (between the metal layers 126-1 and 126-2) and 128-2 (between the metal layers 126-3 and 126-4), and a dielectric core 130 (between the metal layers 126-2 and 126-3). The metal layer 126-1 is the metal layer closest to the surface 172, and the metal layer 126-4 is the metal layer closest to the surface 174. These 4 metal layers 126 may be patterned as desired, and vias formed through the dielectric layers 128 and the dielectric core 130, to form any suitable embedded component 104 (e.g., any suitable ones of the embedded components 104 discussed below) and other conductive pathways, as desired. In some embodiments, the thickness of a dielectric layer 128 may be between 20 microns and 40 microns. In some embodiments, the thickness of a dielectric core 130 may be between 30 microns and 50 microns.

The package substrate 102 of FIG. 6 includes 2 metal layers (126-1 and 126-2), and one dielectric layer 128 (between the metal layers 126-1 and 126-2). The metal layer 126-1 is the metal layer closest to the surface 172, and the metal layer 126-2 is the metal layer closest to the surface 174. These 2 metal layers 126 may be patterned as desired, and vias formed through the dielectric layer 128, to form any suitable embedded component 104 (e.g., any suitable ones of the embedded components 104 discussed below) and other conductive pathways, as desired.

As discussed above with reference to FIG. 3, a ground reference for the embedded components 104 may be located outside the package substrate 102. In another example of such an embodiment, a top metal layer of the circuit board 112 (i.e., the metal layer of the circuit board 112 closest to the surface 172) may provide a ground reference for the embedded components 104. For example, FIG. 7 is a side, cross-sectional view of an example interface between a package substrate 102 (e.g., the package substrate 102 of FIG. 5 or FIG. 6) and a circuit board 112 in an RF communication assembly 100, in accordance with various embodiments. FIG. 7 illustrates the conductive contacts 132 at the surface 172 of the package substrate 102, and conductive contacts 134 at the adjacent surface of the circuit board 112, with solder 119 providing the second-level interconnects 118 between the package substrate 102 and the circuit board 112. The top metal layer of the circuit board 112 may provide the system ground, and the solder 119 (in conjunction with the conductive contacts 132/134) may provide "vias" between this system ground and the metal layer 126-1. In such embodiments, the package substrate 102 may or may not include a ground plane. FIG. 7 also illustrates an air gap between the package substrate 102 and the circuit board 112; when the embedded components 104 include inductors, the presence of this air gap may improve the quality factor of the inductors. Any of the embodiments disclosed herein may include an air gap between the package substrate 102 and the circuit board 112. In some embodiments, the solder 119 may have a diameter between 150 microns and 250 microns (e.g., 180 microns), and the total height of the air gap may be between 250 microns and 300 microns.

FIGS. 8A and 8B illustrate different example metal layers 126-A and 126-B, respectively, in a package substrate 102 of an RF front-end package 150, in accordance with various embodiments. The example metal layers 126-A and 126-B may be included in any of the metal layers 126 and the embodiments of FIGS. 5 and 6. For example, the metal layer 126-A and the metal layer 126-B may be adjacent metal layers, with the metal layer 126-A closer to the surface 172 than the metal layer 126-B. In some embodiments, the metal layer 126-A is the metal layer 126-1 of the embodiment of FIG. 5 or FIG. 6, and the metal layer 126-B is the metal layer 126-2 of the embodiment of FIG. 5 or FIG. 6. Together, the metal layers 126 of FIG. 8 may include a number of embedded components 104, including capacitor plates 140 and inductors 142, as discussed below.

The metal layer 126-A may include capacitor plates 140 and portions of inductors 142. Solder balls 119 of a conductive contact with the metal layer 126-A as indicated by the large dashed circles. The metal layer 126-A may also include a ground plane 138. The ground plane 138 may be non-rectangular (e.g., having an "E"-shape, as shown), and may extend around the capacitor plates 140 and inductor portions 142. Some of the solder balls 119 may make contact with the ground plane 138 to couple the ground plane 138 to a ground of the circuit board 112 (not shown). Having a ground plane 138 that is coplanar with at least some of the capacitor plates 140 and inductor portions 142 may eliminate or reduce the need for separate ground planes above and/or below the passive components, thereby potentially reducing the total metal layer count of the package substrate 102 (and therefore, reducing the size, cost, and manufacturing complexity of the package substrate 102 and improving the reliability of the package substrate 102).

The particular distribution of solder balls 119 illustrated in FIG. 8A may help mitigate the risk of thermal warping during operation. Further, one or more of the solder balls 119 may serve to couple portions of the embedded components 104 to other portions in the circuit board 112 (not shown); for example, an embedded component 104 in the package substrate 102 may include a portion of an inductor 142, and the solder ball 119 may couple this portion of the inductor 142 2 another portion of an inductor 142 in the circuit board 112. Similarly, a capacitor plate 140 in the package substrate 102 may have a complementary capacitor plate 140 in the circuit board 112. Vias 136 coupling the metal layer 126-8 to the metal layer 126-B are indicated by the small dashed circles. The metal layer 126-B may also include capacitor plates 140 and inductors 142. When the metal layer 126-B is the "top" metal layer of the package substrate 102 (e.g., the metal layer 126-2 of the embodiment of FIG. 6), the metal layer 126-B may include contact pads 143 for the discrete components 108. The metal layers 126 illustrated in FIG. 8 may be utilized in any of the package substrates 102 disclosed herein.

The embedded components 104 included in any of the package substrate 102 disclosed herein may be formed using any suitable techniques. For example, inductors, capacitors, and/or other embedded components 104 may include laser-drilled vias (having a circular footprint) or lithographic vias (having any desired footprint, e.g., rectangular). Lithographic package substrate technology may enable a smaller line spacings and vias having arbitrary footprints at the expense of additional manufacturing cost and complexity relative to more "conventional" package substrate technology. FIGS. 9-12 are perspective views of example inductors 142 that may be included in a package substrate 102, in accordance with various embodiments. FIGS. 9 and 10 illustrate inductors 142 including laser-drilled vias 136 between two different patterned metal layers 126, while FIGS. 11 and 12 illustrate analogous inductors 142, respectively, including lithographic vias 136 between two different patterned metal layers 126. The lithographic vias 136 of FIGS. 11 and 12 may be referred to as "wall" vias or "continuous" vias, in contrast to the substantially columnar laser-drilled vias 136. Any of the inductors 142 of any of FIGS. 9-12, or any other passive component including laser-drilled vias or lithographic vias, may be included in any of the package substrate 102 disclosed herein.

FIG. 13 is a perspective view of an example balun 144 that may be included in a package substrate 102 of an RF front-end package 150, in accordance with various embodiments. The balun 144 may be formed using lithographic vias 136 or laser-drilled vias 136, as desired. The balun 144 may include two coils 146-1 and 146-2, each coupled to two terminals 148. The coils 146-1 and 146-2 are each formed across two metal layers 126, with intervening vias 136. The coils 146-1 and 146-2 may be spatially separated (e.g., by a distance between 2 microns and 10 microns). In the embodiment of FIG. 13, the coils 146-1 and 146-2 have non-overlapping footprints, but in other embodiments, the coils 146-1 and 146-2 may interleave. The coils 146 of the balun 144 may be oriented so that the axes of the coils 146 is in the x-y plane (the plane parallel to the metal layers 126), and thus the coupling between the coils 146 occurs in a direction in the x-y plane. This may be in contrast to some existing balun designs, in which the axes of the coils 146 point in the z-direction (perpendicular to the plane of the metal layers 126). The balun 144 of FIG. 13 may serve as an embedded component 104 in any of the embodiments disclosed herein.

Figure 14:
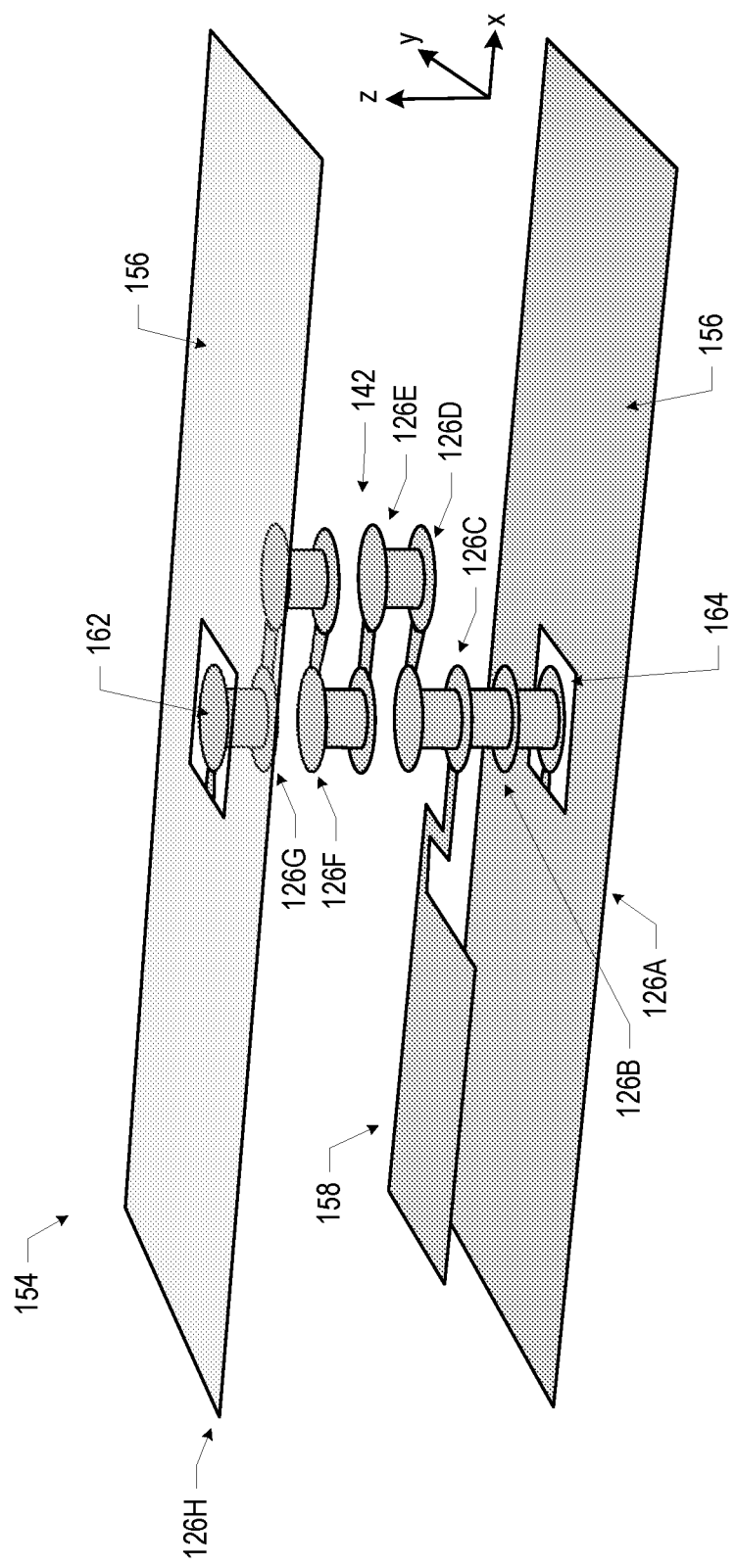
FIG. 14 is a perspective view of an example passive circuit that may be included in an RF front-end package substrate, in accordance with various embodiments.

FIG. 14 is a perspective view of an example passive circuit 154 that may be included in a package substrate 102 of an RF front-end package 150 as an embedded component 104, in accordance with various embodiments. The passive circuit 154 may be formed over eight metal layers (126A-126H) in a package substrate 102, and metal planes 156 may be disposed at either face with apertures therein in which the terminals 162 and 164 are disposed. The passive circuit 154 may include an inductor 142 and a stub 158 serving as a capacitor, providing an LC circuit between the terminals 162 and 164. In use, the terminal 164 may be coupled to or toward an antenna connector 124 or antenna 127 (not shown) and the terminal 162 may be coupled to or toward the RF front-end die 106 (not shown). The passive circuit 154 may be entirely disposed in the footprint of the RF front-end die 106, and thus may help minimize the total footprint of the RF front-end package 150. The passive circuit 154 may be included in any suitable ones of the package substrates 102 disclosed herein. More generally, the elements of the passive circuit 154 may be repeated and rearranged to form any suitable passive circuit.

In some embodiments, the total height of the passive circuit 154 (in the z-direction) may be less than 0.5 millimeters. In some embodiments, a footprint of the passive circuit 154 (in the x-y direction) may be smaller than 100 microns by 100 microns. Small passive circuits, like the passive circuit 154, may be particularly advantageous in millimeter wave communication applications.

The RF assemblies 100 and RF front-end packages 150 disclosed herein may include, or may be included in, any suitable electronic component. FIGS. 15-18 illustrate various examples of apparatuses that may include any of the RF assemblies 100 and RF front-end packages 150 disclosed herein, or may be included in any of the RF assemblies 100 and RF front-end packages 150 disclosed herein, as suitable.

Figures 15, 16:
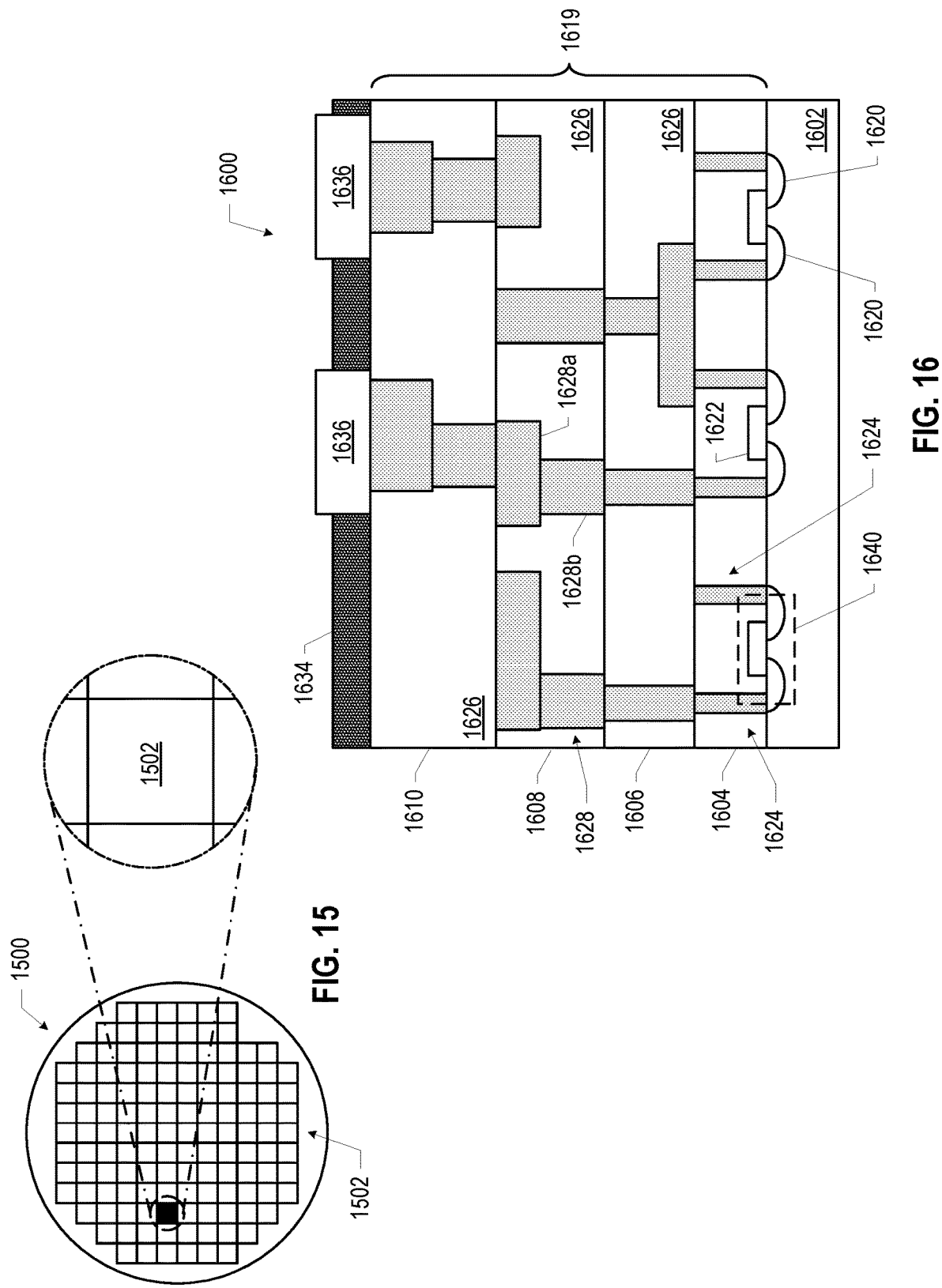
FIG. 15 is a top view of a wafer and dies that may be included in an RF communication assembly or a portion thereof, in accordance with any of the embodiments disclosed herein.
FIG. 16 is a side, cross-sectional view of an integrated circuit (IC) device that may be included in an RF communication assembly or a portion thereof, in accordance with any of the embodiments disclosed herein.

FIG. 15 is a top view of a wafer 1500 and dies 1502 that may include one or more capacitors or other circuit elements that are part of RF front-end circuitry 122 (e.g., as discussed above with reference to FIG. 2), or may be included in an RF front-end package 150 (e.g., as discussed above with reference to FIGS. 2, 3, and 4) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 16, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 18) or other logic that is configured to store information in the memory devices or execute instructions stored in the memory array.

FIG. 16 is a side, cross-sectional view of an IC device 1600 that may include one or more capacitors or other circuit elements that are part of RF front-end circuitry 122 (e.g., as discussed above with reference to FIG. 2), or may be included in an RF front-end package 150 (e.g., as discussed above with reference to FIGS. 2, 3, and 4), in accordance with any of the embodiments disclosed herein. One or more of the IC devices 1600 may be included in one or more dies 1502 (FIG. 15). The IC device 1600 may be formed on a substrate 1602 (e.g., the wafer 1500 of FIG. 15) and may be included in a die (e.g., the die 1502 of FIG. 15). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 15) or a wafer (e.g., the wafer 1500 of FIG. 15).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 16 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 16 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the metallization stack 1619 to route electrical signals according to a wide variety of designs (in particular, the arrangement is not limited to the particular configuration of interconnect structures 1628 depicted in FIG. 16). Although a particular number of interconnect layers 1606-1610 is depicted in FIG. 16, embodiments of the present disclosure include metallization stacks 1619 having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 16. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The metallization stack 1619 may include a dielectric material 1626 disposed between the interconnect structures 1628, as shown in FIG. 16. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

In some embodiments, one or more capacitors or other circuit elements (or portions thereof) of the RF front-end circuitry 122 may be disposed in the metallization stack 1619 (e.g., formed by patterned lines 1628a and/or vias 1628b), in accordance with any of the techniques disclosed herein (not shown in FIG. 16). A capacitor or other circuit element included in the metallization stack 1619 may be referred to as a "back-end" element. In some embodiments, the IC device 1600 may not include any back-end elements. One or more capacitors or other circuit elements in the metallization stack 1619 may be coupled to any suitable ones of the devices in the device layer 1604, and/or to one or more of the conductive contacts 1636 (discussed below).

The IC device 1600 may include a solder resist material 1634 (e.g., polyimide or similar material) and one or more conductive contacts 1636 formed on the interconnect layers 1606-1610. In FIG. 16, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 17:
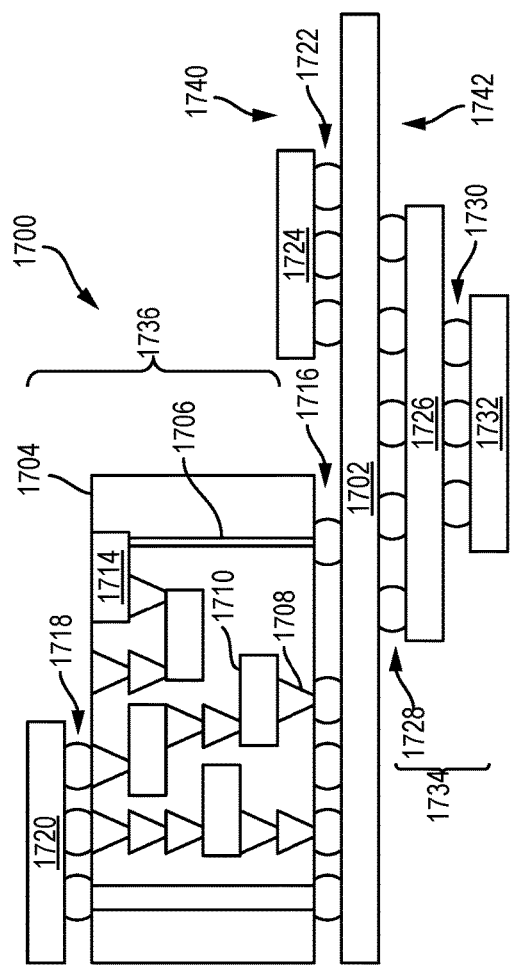
FIG. 17 is a side, cross-sectional view of an IC device assembly that may include or be included in an RF communication assembly, in accordance with any of the embodiments disclosed herein.

FIG. 17 is a side, cross-sectional view of an IC device assembly 1700 that may include one or more RF front-end packages 150, and/or may be part of an RF communication assembly 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the RF front-end packages 150 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 15), an IC device (e.g., the IC device 1600 of FIG. 16), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 17, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may serve as the circuit board 112 in an RF communication assembly 100, in accordance with any of the embodiments disclosed herein.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 18:
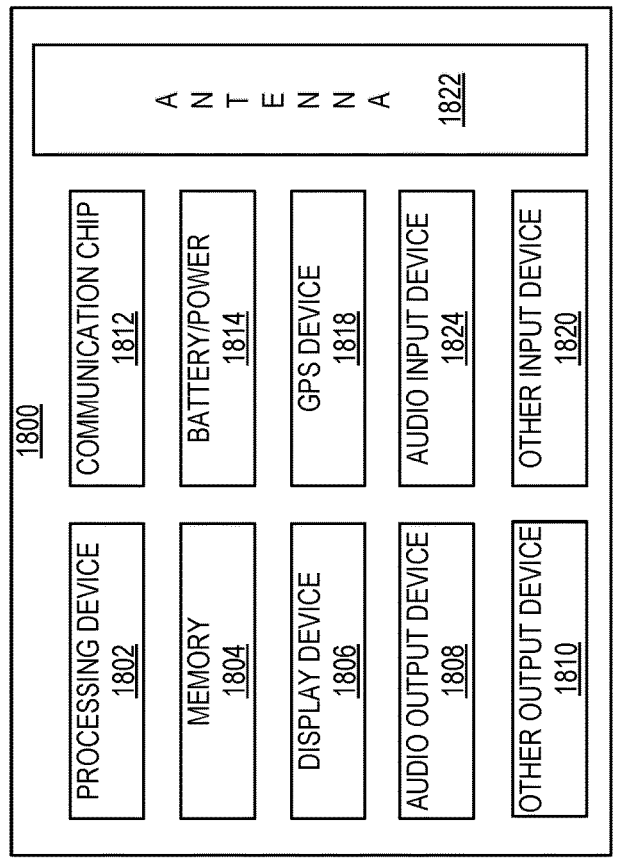
FIG. 18 is a block diagram of an example electrical device that may include an RF communication assembly or a portion thereof, in accordance with any of the embodiments disclosed herein.

FIG. 18 is a block diagram of an example electrical device 1800 that may include one or more RF front-end packages 150 and/or RF assemblies 100, in accordance with any of the embodiments disclosed herein. For example, any suitable ones of the components of the electrical device 1800 may include one or more of the IC device assemblies 1700, IC devices 1600, or dies 1502 disclosed herein. A number of components are illustrated in FIG. 18 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 18, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a radio frequency (RF) communication assembly, including: an RF package substrate including an embedded passive circuit element, wherein at least a portion of the embedded passive circuit element is included in a metal layer of the RF package substrate; and a ground plane in the metal layer of the RF package substrate.

Example 2 includes the subject matter of Example 1, and further specifies that the embedded passive circuit element is a first embedded passive circuit element, the RF package substrate further includes a second embedded passive circuit element, and at least a portion of the embedded passive circuit element is included in the metal layer.

Example 3 includes the subject matter of Example 2, and further specifies that the first embedded passive circuit element is a capacitor and the second embedded passive circuit element is an inductor.

Example 4 includes the subject matter of any of Examples 1-3, and further specifies that the RF package substrate includes no more than four metal layers.

Example 5 includes the subject matter of any of Examples 1-4, and further specifies that the RF package substrate includes no more than two metal layers.

Example 6 includes the subject matter of any of Examples 1-5, and further specifies that the RF package substrate includes conductive contacts for second-level interconnects, and the ground plane is in the metal layer closest to the conductive contacts.

Example 7 includes the subject matter of any of Examples 1-6, and further includes: a circuit board coupled to the RF package substrate.

Example 8 includes the subject matter of Example 7, and further specifies that the circuit board includes a first plate of a capacitor and the metal layer of the RF package substrate includes a second plate of the capacitor.

Example 9 includes the subject matter of any of Examples 7-8, and further specifies that the circuit board is coupled to the RF package substrate at least in part by a plurality of solder balls, and the plurality of solder balls are in electrical contact with the ground plane.

Example 10 includes the subject matter of any of Examples 1-9, and further specifies that the ground plane is non-rectangular.

Example 11 includes the subject matter of any of Examples 1-10, and further includes: an RF processing device coupled to the RF package substrate, wherein the RF processing device is electrically coupled to the embedded passive circuit element.

Example 12 includes the subject matter of Example 11, and further specifies that the RF processing device includes one or more passive circuit elements in its metallization stack.

Example 13 includes the subject matter of any of Examples 1-12, and further specifies that the RF package substrate further includes an embedded balun.

Example 14 includes the subject matter of Example 13, and further specifies that the balun includes two adjacent coils, and the coils are spaced apart in a direction parallel to a plane of the metal layer.

Example 15 includes the subject matter of Example 14, and further specifies that the coils of the balun are interleaved.

Example 16 includes the subject matter of any of Examples 13-15, and further specifies that the balun includes at least one via with a non-circular footprint.

Example 17 includes the subject matter of any of Examples 1-16, and further specifies that the embedded passive circuit element includes at least one wall via.

Example 18 includes the subject matter of any of Examples 1-17, and further specifies that the embedded passive circuit element is part of a harmonic filter.

Example 19 includes the subject matter of any of Examples 1-18, and further specifies that the embedded passive circuit element is part of a matching filter.

Example 20 includes the subject matter of any of Examples 1-19, and further includes: an antenna communicatively coupled to the RF package substrate.

Example 21 includes the subject matter of any of Examples 1-20, and further specifies that the RF communication assembly is a handheld computing device, a tablet computing device, or a wearable computing device.

Example 22 includes the subject matter of any of Examples 1-21, and further specifies that the RF communication assembly is configured for Wi-Fi communication.

Example 23 includes the subject matter of any of Examples 1-22, and further specifies that a footprint of the RF package substrate has an area that is less than 10 square millimeters.

Example 24 is a radio frequency (RF) communication assembly, including: an RF package substrate including a metal layer; and a balun in the RF package substrate, wherein the balun includes a first coil and a second coil, and at least a portion of the first coil and at least a portion of the second coil are in the metal layer.

Example 25 includes the subject matter of Example 24, and further specifies that the first coil and the second coil are spaced apart in a direction parallel to a plane of the metal layer.

Example 26 includes the subject matter of any of Examples 24-25, and further specifies that the first coil and the second coil are interleaved.

Example 27 includes the subject matter of any of Examples 24-26, and further specifies that the first coil and the second coil are spaced apart by a distance between 2 microns and 10 microns.

Example 28 includes the subject matter of any of Examples 24-27, and further specifies that the metal layer is a first metal layer, the RF package substrate includes a second metal layer, and at least a portion of the first coil and at least a portion of the second coil are in the second metal layer.

Example 29 includes the subject matter of any of Examples 24-28, and further specifies that the balun includes at least one via with a non-circular footprint.

Example 30 includes the subject matter of any of Examples 24-29, and further specifies that the RF package substrate includes no more than four metal layers.

Example 31 includes the subject matter of any of Examples 24-30, and further specifies that the RF package substrate includes no more than two metal layers.

Example 32 includes the subject matter of any of Examples 24-31, and further includes: a circuit board coupled to the RF package substrate.

Example 33 includes the subject matter of any of Examples 24-32, and further includes: an RF processing device coupled to the RF package substrate, wherein the RF processing device is electrically coupled to the balun.

Example 34 includes the subject matter of any of Examples 33, and further specifies that the RF processing device includes one or more passive circuit elements in its metallization stack.

Example 35 includes the subject matter of any of Examples 24-34, and further includes: an antenna communicatively coupled to the RF package substrate.

Example 36 includes the subject matter of any of Examples 24-35, and further specifies that the RF communication assembly is a handheld computing device, a tablet computing device, or a wearable computing device.

Example 37 includes the subject matter of any of Examples 24-36, and further specifies that the RF communication assembly is configured for Wi-Fi communication.

Example 38 includes the subject matter of any of Examples 24-37, and further specifies that a footprint of the RF package substrate has an area that is less than 10 square millimeters.

Example 39 is a radio frequency (RF) communication assembly, including: an RF package substrate including an embedded passive circuit element; a processing device coupled to the RF package substrate; a mold compound over the processing device; and a conformal metal layer over the mold compound, wherein the conformal metal layer is conductively coupled to a metal layer in the RF package substrate.

Example 40 includes the subject matter of Example 39, and further specifies that the RF package substrate does not include a ground plane.

Example 41 includes the subject matter of Example 39, and further specifies that the embedded passive circuit element includes a capacitor, an inductor, or a balun.

Example 42 includes the subject matter of any of Examples 39-41, and further specifies that the RF package substrate includes no more than four metal layers.

Example 43 includes the subject matter of any of Examples 39-42, and further specifies that the RF package substrate includes no more than two metal layers.

Example 44 includes the subject matter of any of Examples 39-43, and further includes: a circuit board coupled to the RF package substrate.

Example 45 includes the subject matter of Example 44, and further specifies that the conformal metal layer is conductive coupled to a ground of the circuit board.

Example 46 includes the subject matter of any of Examples 44-45, and further specifies that the circuit board is coupled to the RF package substrate at least in part by a plurality of solder balls.

Example 47 includes the subject matter of any of Examples 39-46, and further specifies that the processing device includes one or more passive circuit elements in its metallization stack.

Example 48 includes the subject matter of any of Examples 39-47, and further specifies that the embedded passive circuit element includes at least one wall via.

Example 49 includes the subject matter of any of Examples 39-48, and further specifies that the embedded passive circuit element is part of a harmonic filter.

Example 50 includes the subject matter of any of Examples 39-49, and further specifies that the embedded passive circuit element is part of a matching filter.

Example 51 includes the subject matter of any of Examples 39-50, and further includes: an antenna communicatively coupled to the RF package substrate.

Example 52 includes the subject matter of any of Examples 39-51, and further specifies that the RF communication assembly is a handheld computing device, a tablet computing device, or a wearable computing device.

Example 53 includes the subject matter of any of Examples 39-52, and further specifies that the RF communication assembly is configured for Wi-Fi communication.

Example 54 includes the subject matter of any of Examples 39-53, and further specifies that a footprint of the RF package substrate has an area that is less than 10 square millimeters.

Example 55 is a radio frequency (RF) communication assembly, including: a flexible RF package substrate; a passive circuit element embedded in the flexible RF package substrate; and one or more discrete components coupled to a surface of the flexible RF package substrate.

Example 56 includes the subject matter of Example 55, and further specifies that the one or more discrete components includes a power amplifier.

Example 57 includes the subject matter of any of Examples 55-56, and further specifies that the one or more discrete components includes a harmonic filter.

Example 58 includes the subject matter of any of Examples 55-57, and further specifies that the one or more discrete components includes a matching filter.

Example 59 includes the subject matter of any of Examples 55-58, and further specifies that the one or more discrete components includes an antenna.

Example 60 includes the subject matter of Example 59, and further specifies that the antenna is proximate to an end of the flexible RF package substrate.

Example 61 includes the subject matter of any of Examples 55-60, and further specifies that the passive circuit element includes a capacitor, an inductor, or a balun.

Example 62 includes the subject matter of any of Examples 55-61, and further specifies that the RF package substrate includes no more than four metal layers.

Example 63 includes the subject matter of any of Examples 55-62, and further specifies that the RF package substrate includes no more than two metal layers.

Example 64 includes the subject matter of any of Examples 55-63, and further includes: a circuit board coupled to the RF package substrate.

Example 65 includes the subject matter of Example 64, and further specifies that the circuit board includes a first plate of a capacitor and a metal layer of the flexible RF package substrate includes a second plate of the capacitor.

Example 66 includes the subject matter of any of Examples 55-65, and further includes: an RF processing device coupled to the flexible RF package substrate.

Example 67 includes the subject matter of Example 66, and further specifies that the RF processing device includes one or more passive circuit elements in its metallization stack.

Example 68 includes the subject matter of Example 67, and further specifies that at least one of the one or more discrete components is between the RF processing device and an antenna along the flexible RF package substrate.

Example 69 includes the subject matter of any of Examples 55-68, and further specifies that the passive circuit element includes at least one wall via.

Example 70 includes the subject matter of any of Examples 55-69, and further specifies that the RF communication assembly is a handheld computing device, a tablet computing device, or a wearable computing device.

Example 71 includes the subject matter of any of Examples 55-70, and further specifies that the RF communication assembly is configured for Wi-Fi communication.

The invention claimed is:

1. A radio frequency (RF) communication assembly, comprising:
    an RF package substrate including an embedded passive circuit element;
    a processing device coupled to the RF package substrate;
    a mold compound over the processing device; and
    a conformal metal layer over the mold compound, wherein the conformal metal layer is conductively coupled to a metal layer in the RF package substrate.

2. The RF communication assembly of claim 1, wherein the RF package substrate does not include a ground plane.

3. The RF communication assembly of claim 1, wherein the embedded passive circuit element includes a capacitor, an inductor, or a balun.

4. The RF communication assembly of claim 1, wherein the RF package substrate includes no more than four metal layers.

5. The RF communication assembly of claim 1, further comprising a circuit board coupled to the RF package substrate.

6. The RF communication assembly of claim 5, wherein the conformal metal layer is conductively coupled to a ground of the circuit board.

7. The RF communication assembly of claim 5, wherein the circuit board is coupled to the RF package substrate at least in part by a plurality of solder balls.

8. The RF communication assembly of claim 1, wherein the processing device includes one or more passive circuit elements in its metallization stack.

9. The RF communication assembly of claim 1, wherein the embedded passive circuit element includes at least one wall via.

10. The RF communication assembly of claim 1, wherein the embedded passive circuit element is part of a harmonic filter.

11. The RF communication assembly of claim 1, wherein the embedded passive circuit element is part of a matching filter.

12. The RF communication assembly of claim 1, further comprising an antenna communicatively coupled to the RF package substrate.

13. The RF communication assembly of claim 1, wherein the RF communication assembly is a handheld computing device, a tablet computing device, or a wearable computing device.

14. The RF communication assembly of claim 1, wherein the RF communication assembly is configured for Wi-Fi communication.

15. The RF communication assembly of claim 1, wherein a footprint of the RF package substrate has an area that is less than 10 square millimeters.

16. A radio frequency (RF) communication assembly, comprising:
    an RF package substrate including an embedded passive circuit element, wherein at least a portion of the embedded passive circuit element is included in a metal layer of the RF package substrate; and
    a circuit board coupled to the RF package substrate, wherein the circuit board includes a first plate of a capacitor and the metal layer of the RF package substrate includes a second plate of the capacitor.

17. The RF communication assembly of claim 16, wherein the embedded passive circuit element is part of a harmonic filter or a matching filter.

18. The RF communication assembly of claim 16, wherein the RF package substrate further includes a ground plane, and wherein the ground plane is non-rectangular.

19. A radio frequency (RF) communication assembly, comprising:
    an RF package substrate including an embedded passive circuit element;
    a processing device coupled to the RF package substrate;
    a mold compound over the processing device; and
    a conformal metal layer over the mold compound, wherein the RF package substrate does not include a ground plane.

20. The RF communication assembly of claim 19, wherein the embedded passive circuit element includes a capacitor, an inductor, or a balun.

\* \* \* \* \*